(12) United States Patent
Bando et al.

(10) Patent No.: US 12,709,708 B2
(45) **Date of Patent: *Aug. 18, 2026**

(54) LIGHT EMITTING DEVICE AND LIGHTING FIXTURE PROVIDED WITH SAME

(71) Applicant: NICHIA CORPORATION, Anan (JP)

(72) Inventors: Atsushi Bando, Anan (JP); Keigo Nishida, Anan (JP)

(73) Assignee: NICHIA CORPORATION, Anan (JP)

( * ) Notice: Subject to any disclaimer, the term of this patent is extended or adjusted under 35 U.S.C. 154(b) by 896 days.

This patent is subject to a terminal disclaimer.

(21) Appl. No.: 17/907,403

(22) PCT Filed: Feb. 17, 2021

(86) PCT No.: PCT/JP2021/005874

§ 371 (c)(1), (2) Date: Sep. 26, 2022

(87) PCT Pub. No.: WO2021/192743

PCT Pub. Date: Sep. 30, 2021

(65) Prior Publication Data

US 2023/0151273 A1 May 18, 2023

(30) Foreign Application Priority Data

Mar. 27, 2020 (JP) ................................ 2020-056981
Jan. 28, 2021 (JP) ................................ 2021-011944

(51) Int. Cl.
*C09K 11/77* (2006.01)
*C09K 11/02* (2006.01)
(Continued)

(52) U.S. Cl.
CPC .... *C09K 11/7774* (2013.01); *C09K 11/77348* (2021.01); *H10H 20/8513* (2025.01)

(58) Field of Classification Search
CPC ..... C09K 11/02; C09K 11/615; C09K 11/616; C09K 11/77; C09K 11/77342;
(Continued)

(56) References Cited

U.S. PATENT DOCUMENTS 6,504,179 B1 1/2003 Ellens et al.
7,002,291 B2 2/2006 Ellens et al.
(Continued)

FOREIGN PATENT DOCUMENTS

CN 109545941 A 3/2019
EP 3249703 A1 11/2017
(Continued)

*Primary Examiner* — Matthew E. Hoban
*Assistant Examiner* — Lynne Edmondson
(74) *Attorney, Agent, or Firm* — Hunton Andrews Kurth LLP

(57) ABSTRACT

To provide a light emitting device that has an excellent color rendering property and a high light emission efficiency, and a lighting fixture provided with the same. A light emitting device including a light emitting element having a light emission peak wavelength in a range of 430 nm or more and 470 nm or less, and a fluorescent member including two or more kinds of rare earth aluminate fluorescent materials including at least one kind selected from the group consisting of a first fluorescent material having a composition represented by the following formula (I) ($Y_3(Al,Ga)_5O_{12}$:Ce), a second fluorescent material having a composition represented by the following formula (II) ($Lu_3Al_5O_{12}$:Ce), and a third fluorescent material having a composition represented by the following formula (III) ($Y_3Al_5O_{12}$:Ce), a fourth fluorescent material having a composition represented by the following formula (IV) ($A_2[M1_{1-p}Mn^{4+}{}_pF_6]$), and a fifth fluorescent material having a composition represented by the following formula (V) ((Sr,Ca)$AlSiN_3$:Eu).

22 Claims, 7 Drawing Sheets

(51) Int. Cl.
*C09K 11/61* (2006.01)
*H10H 20/851* (2025.01)

(58) Field of Classification Search
CPC .......... C09K 11/77348; C09K 11/7734; C09K 11/7774; C09K 11/7715; C09K 11/0838; H10H 20/8513; H10H 20/8512; H10H 20/0361; H01L 25/167
See application file for complete search history.

(56) References Cited

U.S. PATENT DOCUMENTS

| | | | | |
|---|---|---|---|---|
| 7,183,706 | B2 | 2/2007 | Ellens et al. | |
| 8,890,403 | B2 | 11/2014 | Sakuta et al. | |
| 9,109,762 | B2 | 8/2015 | Yamakawa et al. | |
| 10,008,643 | B2 | 6/2018 | Asai | |
| 10,020,427 | B2 | 7/2018 | Hiramatsu et al. | |
| 10,084,119 | B2 | 9/2018 | Onuma et al. | |
| 10,141,484 | B2 | 11/2018 | Asai | |
| 10,434,280 | B2 | 10/2019 | Peeters et al. | |
| 10,559,725 | B2 | 2/2020 | Asai | |
| 10,818,827 | B2 | 10/2020 | Fujio et al. | |
| 10,854,792 | B2 | 12/2020 | Kusano et al. | |
| 10,910,526 | B2 | 2/2021 | Amiya et al. | |
| 11,011,684 | B2 | 5/2021 | Asai | |
| 11,605,761 | B2 | 3/2023 | Fujio et al. | |
| 11,990,570 | B2 | 5/2024 | Kim et al. | |
| 2003/0006469 | A1 | 1/2003 | Ellens et al. | |
| 2005/0104503 | A1 | 5/2005 | Ellens et al. | |
| 2006/0103291 | A1 | 5/2006 | Ellens et al. | |
| 2013/0264937 | A1 | 10/2013 | Sakuta et al. | |
| 2015/0380614 | A1 | 12/2015 | Hiramatsu et al. | |
| 2016/0372638 | A1 | 12/2016 | Todorov et al. | |
| 2017/0179347 | A1* | 6/2017 | Asai | C09K 11/0883 |
| 2017/0345976 | A1* | 11/2017 | Asai | C09K 11/7721 |
| 2019/0198724 | A1 | 6/2019 | Amiya et al. | |
| 2020/0405997 | A1 | 12/2020 | Shan et al. | |
| 2021/0126169 | A1 | 4/2021 | Amiya et al. | |
| 2021/0136891 | A1 | 5/2021 | Eguchi et al. | |
| 2021/0308480 | A1 | 10/2021 | Lorenz | |
| 2021/0404632 | A1 | 12/2021 | Niki et al. | |
| 2022/0047890 | A1 | 2/2022 | Falck | |

FOREIGN PATENT DOCUMENTS

| | | | |
|---|---|---|---|
| EP | 3648183 | A1 | 5/2020 |
| JP | 2003535477 | A | 11/2003 |
| JP | 2003535478 | A | 11/2003 |
| JP | 2012104814 | A | 5/2012 |
| JP | 2014177511 | A | 9/2014 |
| JP | 2014197536 | A | 10/2014 |
| JP | 2014202266 | A | 10/2014 |
| JP | 2016069576 | A | 5/2016 |
| JP | 2016072614 | A | 5/2016 |
| JP | 2016154205 | A | 8/2016 |
| JP | 2016188263 | A | 11/2016 |
| JP | 2016195284 | A | 11/2016 |
| JP | 2016207824 | A | 12/2016 |
| JP | 2017017317 | A | 1/2017 |
| JP | 2017117875 | A | 6/2017 |
| JP | 2018511386 | A | 4/2018 |
| JP | 2019009126 | A | 1/2019 |
| JP | 2019067808 | A | 4/2019 |
| JP | 2019117838 | A | 7/2019 |
| WO | 2012144087 | A1 | 10/2012 |
| WO | 2014203841 | A1 | 12/2014 |
| WO | 2019004119 | A1 | 1/2019 |

* cited by examiner

FIG. 4

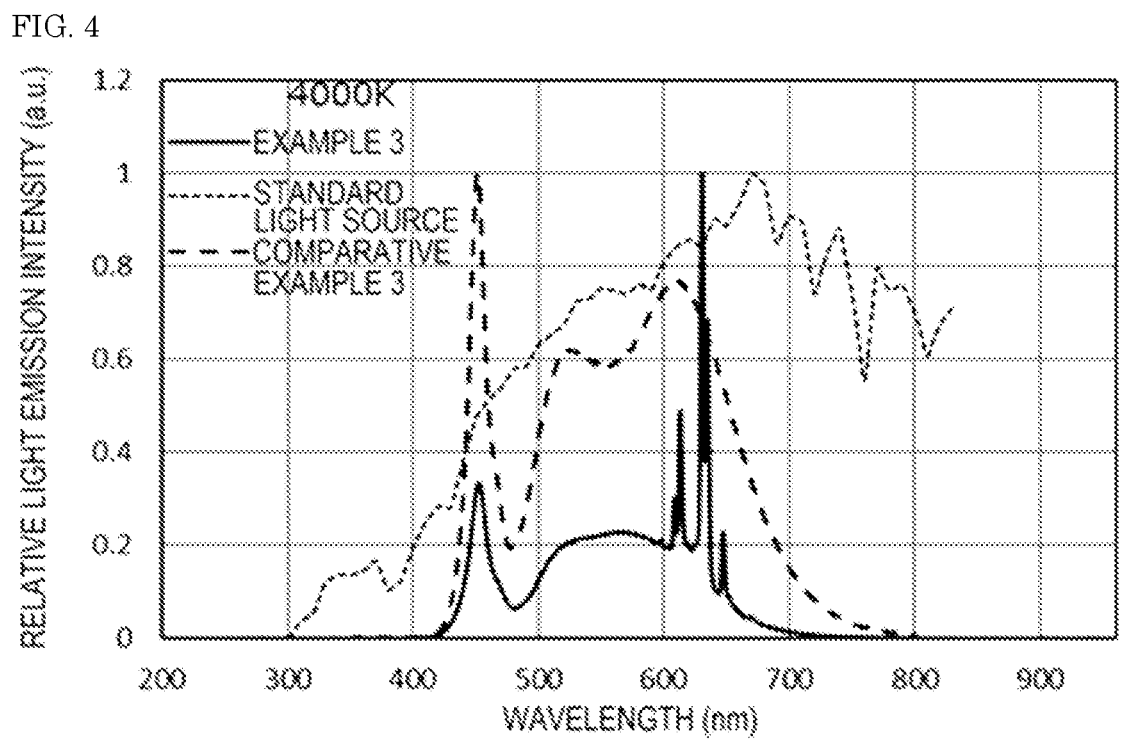

4000K
EXAMPLE 3
STANDARD LIGHT SOURCE
COMPARATIVE EXAMPLE 3
RELATIVE LIGHT EMISSION INTENSITY (a.u.)
1.2
1
0.8
0.6
0.4
0.2
0
200
300
400
500
600
700
800
900
WAVELENGTH (nm)

LIGHT EMITTING DEVICE AND LIGHTING FIXTURE PROVIDED WITH SAME

CROSS-REFERENCE TO RELATED APPLICATIONS

This application is a national stage entry of International Application No. PCT/JP2021/005874, filed on Feb. 17, 2021, which claims priority to Japanese Patent Application No. 2020-056981, filed on Mar. 27, 2020, and Japanese Patent Application No. 2021-011944, filed on Jan. 28, 2021, the disclosures of which are hereby incorporated by reference in their entireties.

TECHNICAL FIELD

The present description relates to a light emitting device and a lighting fixture provided with the same.

BACKGROUND ART

A light emitting device using a light emitting element referred to as a light emitting diode (which may be hereinafter referred to as an "LED") is receiving attention. Examples include a light emitting device including a combination of an LED emitting blue light and a fluorescent material emitting yellow light. The light emitting device emits white light by mixing blue light of the blue LED and yellow light emitted from the fluorescent material excited by the blue light.

The light emitting device including a combination of a light emitting element emitting blue light and a fluorescent material emitting yellow light has a high light emission efficiency due to the strong radiation intensity in the visible light region. Furthermore, a light emitting device having a high average color rendering index, which is an index of the visibility of color (color rendering property) of the radiated matter, may be demanded in some cases.

The evaluation procedure of the color rendering property of a light source is determined by JIS Z8726 in such a manner that the color differences ΔEi (wherein i represents an integer of 1 to 15) in the colorimetry of the test colors (R1 to R15) having the prescribed reflectance characteristics with the test light source and the standard light source are calculated through numerical calculation. The upper limit of each of the color rendering indices Ri (wherein i represents an integer of 1 to 15) is 100. Accordingly, in the case where the color difference between the test light source and the standard light source having a color temperature corresponding to the test light source is smaller, the color rendering index is increased close to 100.

In relation to the foregoing, a light emitting device using an LED emitting blue light and two kinds of fluorescent materials emitting yellow to green light has been proposed, and is said to achieve high color reproducibility (see, for example, Patent Documents 1 and 2).

CITATION LIST

Patent Document

Patent Document 1: Japanese Patent Laid-Open No. 2003-535477

Patent Document 2: Japanese Patent Laid-Open No. 2003-535478

SUMMARY OF THE INVENTION

Problem to be Solved by the Invention

However, in the case where the average color rendering index Ra is to be increased, the light emission efficiency of the light emitting device tends to decrease. In recent years, furthermore, as for the light emitting device using an LED, in some cases, there is a demand of a light emitting device that has a high light emission efficiency and simultaneously has not only a high average color rendering index Ra, but also a high particular color rendering index, for example, R15.

An object of an embodiment of the present description is to provide a light emitting device that has a high particular color rendering index and a high light emission efficiency, and a lighting fixture provided with the same.

Means for Solving Problem

The present invention encompasses the following embodiments.

A first embodiment relates to a light emitting device including a light emitting element having a light emission peak wavelength in a range of 430 nm or more and 470 nm or less, and a fluorescent member including two or more kinds of rare earth aluminate fluorescent materials including at least one kind selected from the group consisting of a first fluorescent material having a composition represented by the following formula (I), a second fluorescent material having a composition represented by the following formula (II), and a third fluorescent material having a composition represented by the following formula (III), a fourth fluorescent material having a composition represented by the following formula (IV), and a fifth fluorescent material having a composition represented by the following formula (V):

$$Y_3(Al,Ga)_5O_{12}:Ce \quad (I)$$

$$Lu_3Al_5O_{12}:Ce \quad (II)$$

$$Y_3Al_5O_{12}:Ce \quad (III)$$

$$A_2[M1_{1-p}Mn^{4+}{}_pF_6] \quad (IV)$$

$$(Sr,Ca)AlSiN_3:Eu \quad (V)$$

wherein in the formula (IV), A includes at least one kind selected from the group consisting of K, Li, Na, Rb, Cs, and $NH_4^+$, M1 includes at least one kind of an element selected from the group consisting of a Group 4 element, a Group 13 element, and a Group 14 element, and p represents a number satisfying $0<p<0.2$.

A second embodiment relates to a lighting fixture provided with the light emitting device.

Effect of the Invention

According to an embodiment of the present description, a light emitting device that is capable of achieving an excellent color rendering property and a high light emission efficiency, and a lighting fixture provided with the same.

BRIEF DESCRIPTION OF DRAWINGS

FIG. 4 is a diagram showing the light emission spectrum of the light emitting device of Example 3, the light emission spectrum of the light emitting device of Comparative Example 3, and the spectrum of the standard light source having a correlated color temperature of 4,000 K.

MODE(S) FOR CARRYING OUT THE INVENTION

Figure 1:
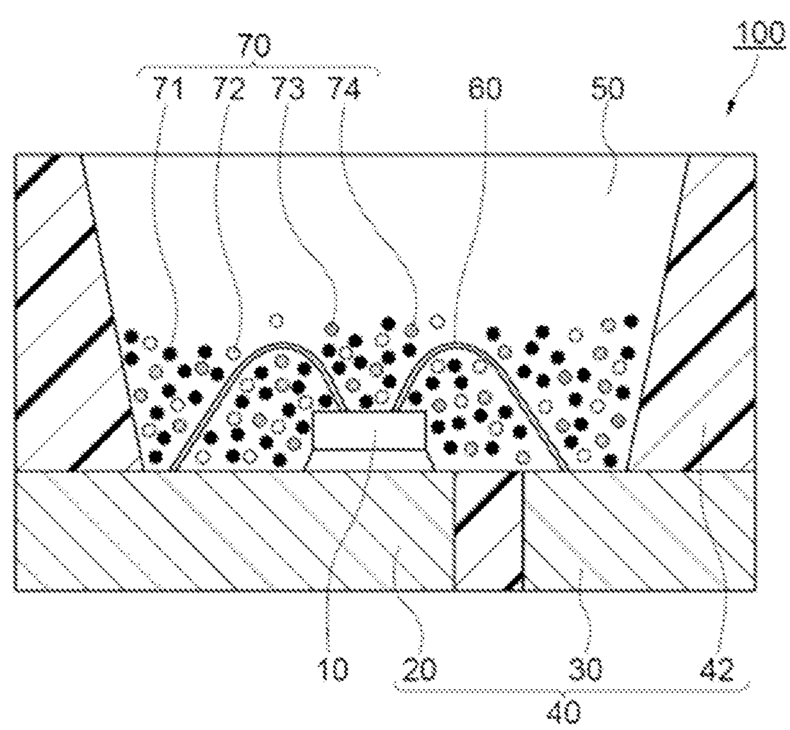
FIG. 1 is a schematic cross sectional view of an embodiment of the light emitting device according to the present invention.
Figure 2:
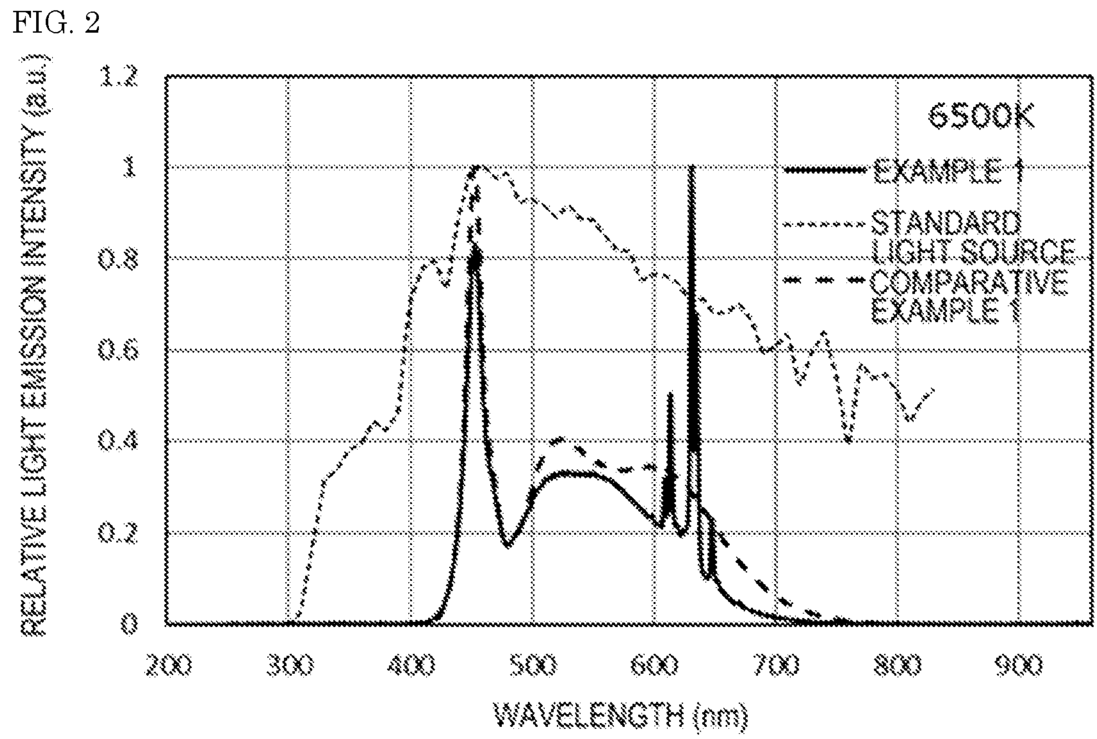
FIG. 2 is a diagram showing the light emission spectrum of the light emitting device of Example 1, the light emission spectrum of the light emitting device of Comparative Example 1, and the spectrum of the standard light source having a correlated color temperature of 6,500 K.
Figure 3:
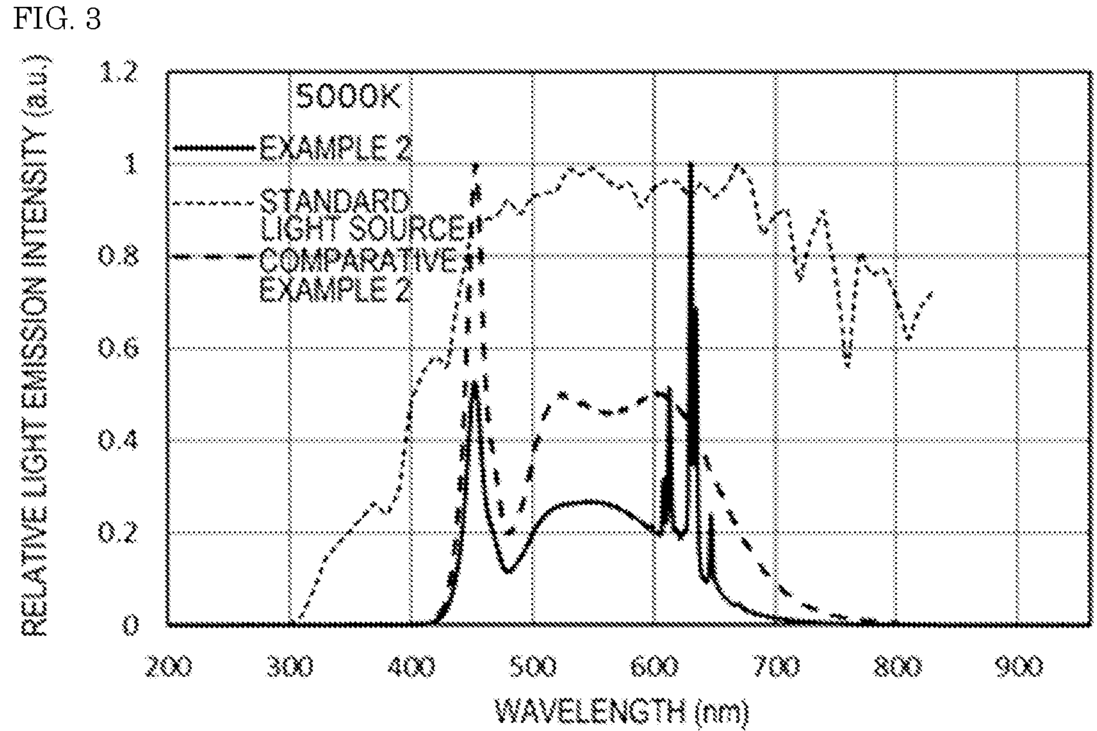
FIG. 3 is a diagram showing the light emission spectrum of the light emitting device of Example 2, the light emission spectrum of the light emitting device of Comparative Example 2, and the spectrum of the standard light source having a correlated color temperature of 5,000 K.
Figure 5:
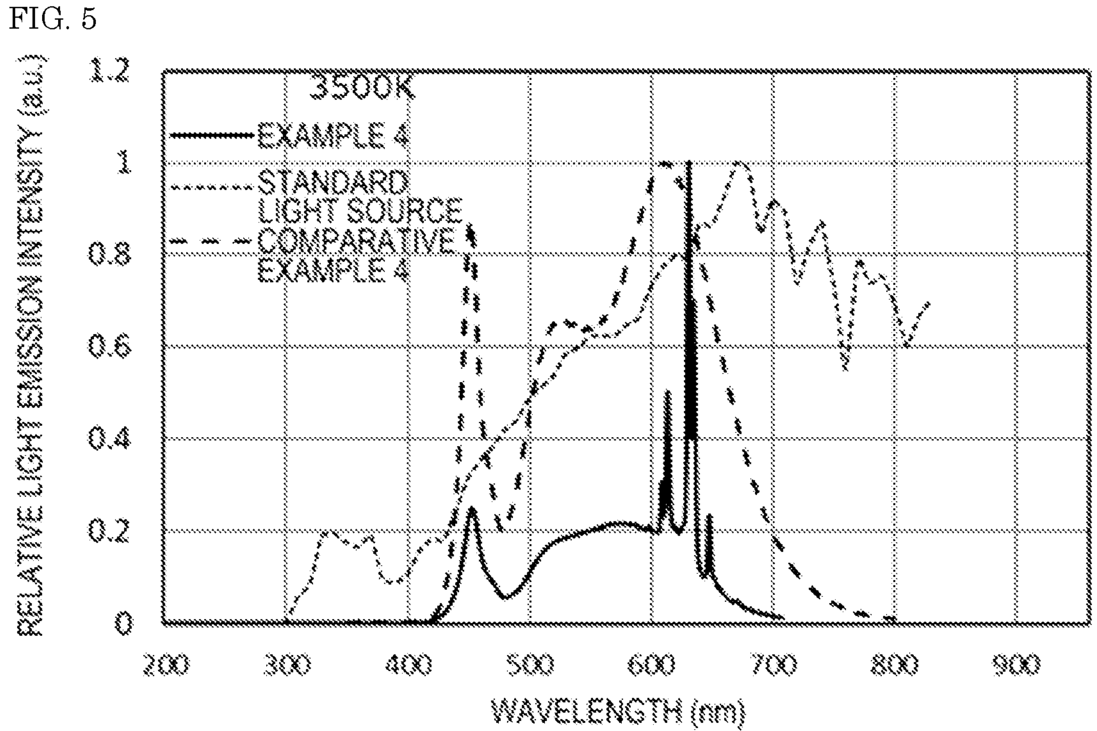
FIG. 5 is a diagram showing the light emission spectrum of the light emitting device of Example 4, the light emission spectrum of the light emitting device of Comparative Example 4, and the spectrum of the standard light source having a correlated color temperature of 3,500 K.
Figure 6:
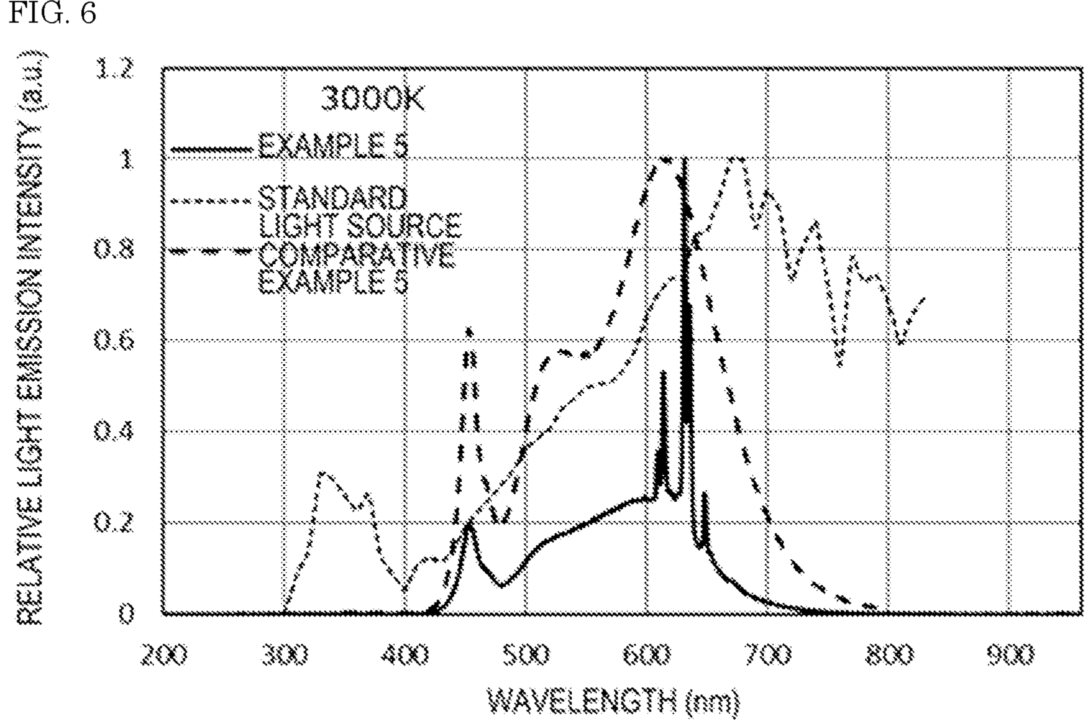
FIG. 6 is a diagram showing the light emission spectrum of the light emitting device of Example 5, the light emission spectrum of the light emitting device of Comparative Example 5, and the spectrum of the standard light source having a correlated color temperature of 3,000 K.
Figure 7:
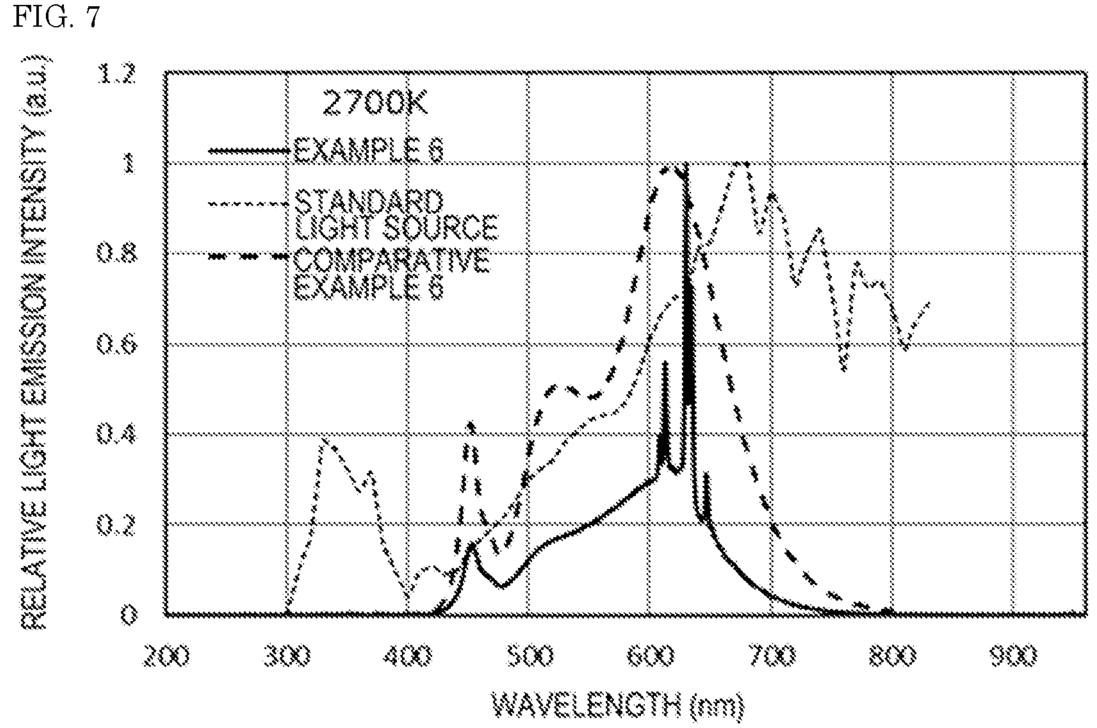
FIG. 7 is a diagram showing the light emission spectrum of the light emitting device of Example 6, the light emission spectrum of the light emitting device of Comparative Example 6, and the spectrum of the standard light source having a correlated color temperature of 2,700 K.

The light emitting device and the lighting fixture provided with the same according to the present description will be described with reference to embodiments below. However, the embodiments shown below are for practicing the technical concept of the present invention, and do not identify the present invention. In the description herein, the relationship between color names and chromaticity coordinates, the relationship between wavelength ranges and color names of monochromic light, and the like are in accordance with JIS Z8110. In the case where plural substances corresponding to each of the components exist in the composition, the content of each of the components in the composition means the total amount of the plural substances existing in the composition, unless otherwise indicated. The average particle diameter of the fluorescent material is a value referred to as a Fisher Sub Sieve Sizer's No., and measured by the air permeability method.

[Light Emitting Device] The light emitting device includes a light emitting element having a light emission peak wavelength in a range of 430 nm or more and 470 nm or less, and a fluorescent member including two or more kinds of rare earth aluminate fluorescent materials including at least one kind selected from the group consisting of a first fluorescent material having a composition represented by the following formula (I), a second fluorescent material having a composition represented by the following formula (II), and a third fluorescent material having a composition represented by the following formula (III), a fourth fluorescent material having a composition represented by the following formula (IV), and a fifth fluorescent material having a composition represented by the following formula (V).

$$Y_3(Al,Ga)_5O_{12}:Ce \quad (I)$$

$$Lu_3Al_5O_{12}:Ce \quad (II)$$

$$Y_3Al_5O_{12}:Ce \quad (III)$$

$$A_2[M1_{1-p}Mn^{4+}{}_pF_6] \quad (IV)$$

$$(Sr,Ca)AlSiN_3:Eu \quad (V)$$

In the formula (IV), A includes at least one kind selected from the group consisting of K, Li, Na, Rb, Cs, and $NH_4^+$, M1 includes at least one kind of an element selected from the group consisting of a Group 4 element, a Group 13 element, and a Group 14 element, and p represents a number satisfying $0<p<0.2$.

The light emitting element having a light emission peak wavelength in a range of 430 nm or more and 470 nm or less emitting blue-violet color to blue color is used in combination with the two or more kinds of rare earth aluminate fluorescent materials including at least one kind selected from the group consisting of the first fluorescent material, the second fluorescent material, and the third fluorescent material, in addition to the fourth fluorescent material and the fifth fluorescent material emitting red light. According to the configuration, the light emission spectrum of blue-violet color to blue color in a range of 430 nm or more and 470 nm or less can be suppressed from becoming an especially high intensity, and the light emission intensity of the light emission spectrum in a wavelength range of the emitted light of yellow color to green color can be largely enhanced. In particular, the phenomenon that only the light emission spectrum in a wavelength range of blue-violet color to blue color becomes an especially high intensity can be suppressed, and the light emission spectrum in a wavelength range of the emitted light of yellow color to green color can be further approximated to the standard light source to increase the light emission component of green light having a high luminosity factor, enabling the achievement of an excellent color rendering property and a high light emission efficiency.

As for the color rendering property, CIE (Commission Internationale de l'Eclairage) published the guidelines of the color rendering property that fluorescent lamps should satisfy in 1986, and according to the guidelines, the preferred average color rendering index (which is hereinafter referred to as "Ra") corresponding to the use sites is 60 or more and less than 80 for worksites for general work, 80 or more and less than 90 for residential houses, hotels, restaurants, stores, offices, schools, hospitals, worksites for precise work, and the like, and 90 or more for places for clinical examination, museums, and the like requiring a high color rendering property.

The Ra of the light emitting device is, for example, 80 or more, preferably 90 or more, and more preferably 95 or more. The upper limit of the Ra is 100. The special color rendering indices are expressed by indices R9 to R15, and are designated as red for R9, yellow for R10, green for R11, blue for R12, Westerner skin color for R13, leaf color for R14, and Japanese skin color for R15. The special color rendering indices are said to be preferably as high as possible, and the R9 to R15 of the light emitting device of the present embodiment each are, for example, 50 or more, preferably 60 or more, more preferably 70 or more, and further preferably 80 or more. The upper limit of each of the R9 to R15 is 100. The R15 of the light emitting device is preferably a further higher value, and is particularly preferably, 85 or more, 90 or more, 92 or more, or 93 or more.

The light emitted from the light emitting device is mixed light of the light emitted from the light emitting element, and the fluorescent light emitted from the two or more kinds of rare earth aluminate fluorescent materials including at least one kind selected from the group consisting of the first fluorescent material, the second fluorescent material, and the third fluorescent material, the fourth fluorescent material, and the fifth fluorescent material, and may be, for example, light included in a chromaticity coordinate according to CIE 1931 in a range of x=0.20 to 0.50 and y=0.20 to 0.50, and may be light included in a range of x=0.30 to 0.50 and y=0.30 to 0.45.

The correlated color temperature of the light emitted from the light emitting device may be, for example, 2,000 K or more, and may be 2,500 K or more. The correlated color temperature may be 8,000 K or less, and may be 7,000 K or less.

A light emitting device 100 as one example of the light emitting device will be described with reference to the drawing. FIG. 1 is a schematic cross sectional view showing the light emitting device 100.

The light emitting device 100 includes a light emitting element 10 of a gallium nitride-based compound semiconductor emitting light on the short wavelength side of visible light (for example, in a range of 380 nm or more and 485 nm or less) having a light emission peak wavelength in a range of 430 nm or more and 470 nm or less, and a molded article 40 for mounting the light emitting element 10 thereon. The molded article 40 includes a first lead 20, a second lead 30, and a resin part 42 containing a thermoplastic resin or a thermosetting resin, which are integrally molded. The molded article 40 has formed therein a recessed portion having a bottom surface and a side surface, and the light emitting element 10 is placed on the bottom surface of the recessed portion. The light emitting element 10 has one pair of positive and negative electrodes, and the one pair of positive and negative electrodes are electrically connected to the first lead 20 and the second lead 30 via wire 60, respectively. The light emitting element 10 is covered with a fluorescent member 50. The fluorescent member 50 includes, for example, as a fluorescent material 70 that converts the wavelength of the light from the light emitting element 10, two kinds of rare earth aluminate fluorescent materials 71 and 72 containing at least one kind selected from the group consisting of a first fluorescent material, a second fluorescent material, and a third fluorescent material, a fourth fluorescent material 73, a fifth fluorescent material 74, and a resin.

The fluorescent member 50 not only converts the wavelength of the light emitted by the light emitting element 10, but also functions as a member for protecting the light emitting element 10 from the external environment. In FIG. 1, the fluorescent material 70 is localized in the fluorescent member 50. In the case where the fluorescent material 70 is placed close to the light emitting element 10 in this manner, the wavelength of the light from the light emitting element 10 can be efficiently converted, resulting in a light emitting device excellent in light emission efficiency. The positions of the fluorescent member 50 including the fluorescent material 70, and the light emitting element 10 are not limited to the configuration in which these articles are placed close to each other, and the fluorescent material 70 may be placed in the fluorescent member 50 apart from the light emitting element 10 in consideration of the influence of heat on the fluorescent material 70. In alternative, the fluorescent material 70 may be mixed substantially uniformly over the fluorescent member 50, so as to provide light having further suppressed color unevenness.

(Light Emitting Element)

The light emitting element has a light emission peak wavelength in a range of 430 nm or more and 470 nm or less, and from the standpoint of the light emission efficiency and the color rendering property, is preferably in a range of 440 nm or more and 465 nm or less, more preferably in a range of 445 nm or more and 460 nm or less, and may be in a range of 450 nm or more and 460 nm or less. With the use of the light emitting element as the excitation light source, the light emitting device emitting mixed light of the light from the light emitting element and the fluorescent light from the fluorescent material is constituted.

The full width at half maximum of the light emission spectrum of the light emitting element may be, for example, 30 nm or less.

The light emitting element used is preferably a semiconductor light emitting element, such as an LED. The use of a semiconductor light emitting element as the light source can provide a light emitting device that has a high efficiency, output having a high linearity to input, and a high strength against mechanical impacts, resulting in high stability thereof.

Examples of the semiconductor light emitting element used include a semiconductor light emitting element emitting blue light or the like using a nitride-based semiconductor ($In_XAl_YGa_{1-X-Y}N$, wherein X and Y satisfy $0 \leq X$, $0 \leq Y$, and $X+Y \leq 1$).

In the description herein, the full width at half maximum means the full width at half maximum of the light emission peak in the light emission spectrum, i.e., the wavelength width of the light emission peak showing 50% of the maximum value of the light emission peak in the light emission spectrum.

(Fluorescent Material)

The light emitting device includes a fluorescent member that absorbs a part of the light emitted from the light emitting element, and includes two or more kinds of rare earth aluminate fluorescent materials including at least one kind selected from the group consisting of the first fluorescent material having a composition represented by the formula (I), the second fluorescent material having a composition represented by the formula (II), and the third fluorescent material having a composition represented by the formula (III), the fourth fluorescent material having a composition represented by the formula (IV), and the fifth fluorescent material having a composition represented by the formula (V). The first fluorescent material, the second fluorescent material, the third fluorescent material, the fourth fluorescent material, and the fifth fluorescent material have the particular compositions represented by the aforementioned formulae, respectively. The component ratio of the two or more kinds of rare earth aluminate fluorescent materials including at least one kind selected from the group consisting of the first fluorescent material, the second fluorescent material, and the third fluorescent material, the fourth fluorescent material, and the fifth fluorescent material contained in the fluorescent member is appropriately selected, and thereby the color rendering property can be regulated to the desired range, for example, the average color rendering index Ra of the light emitting device can be regulated to 90 or more, and the special color rendering index R15 thereof can be regulated to 85 or more, while enhancing the light flux of the light emitting device.

The content of the fourth fluorescent material with respect to the total content of the rare earth aluminate fluorescent materials may be selected corresponding to the target correlated color temperature of the light emitting device. For example, in the case where the light emitting device emitting light having a correlated color temperature in a range of 4,750 K or more and 7,000 K or less is to be achieved, the content of the fourth fluorescent material with respect to the total content of the rare earth aluminate fluorescent materials is preferably in a range of 0.35 or more and 0.7 or less, and more preferably in a range of 0.4 or more and 0.65 or less, from the standpoint of the light flux and the color rendering property. In the case where the light emitting device emitting light having a correlated color temperature in a range of 2,500 K or more and 4,750 K or less is to be achieved, the content of the fourth fluorescent material with respect to the total content of the rare earth aluminate fluorescent materials is preferably in a range of 0.7 or more and 1.3 or less, and more preferably in a range of 0.75 or more and 1.2 or less, from the standpoint of the light flux and the color rendering property.

The content of the fourth fluorescent material with respect to the total content of the rare earth aluminate fluorescent materials, the fourth fluorescent material, and the fifth fluorescent material (which may be hereinafter referred to as a "total fluorescent material content") may be selected corresponding to the target correlated color temperature of the light emitting device. For example, in the case where the light emitting device emitting light having a correlated color temperature in a range of 4,750 K or more and 7,000 K or less is to be achieved, the content of the fourth fluorescent material with respect to the total fluorescent material content is preferably in a range of 0.25 or more and 0.45 or less, and more preferably in a range of 0.27 or more and 0.4 or less, from the standpoint of the light flux and the color rendering property. In the case where the light emitting device emitting light having a correlated color temperature in a range of 2,500 K or more and 4,750 K or less is to be achieved, the content of the fourth fluorescent material with respect to the total fluorescent material content is preferably in a range of 0.4 or more and 0.6 or less, and more preferably in a range of 0.4 or more and 0.55 or less, from the standpoint of the light flux and the color rendering property.

The total content of the rare earth aluminate fluorescent materials with respect to the total fluorescent material content may be selected corresponding to the target correlated color temperature of the light emitting device. For example, in the case where the light emitting device emitting light having a correlated color temperature in a range of 4,750 K or more and 7,000 K or less is to be achieved, the total content of the rare earth aluminate fluorescent materials with respect to the total fluorescent material content is preferably in a range of 0.5 or more and 0.75 or less, and more preferably in a range of 0.55 or more and 0.7 or less, from the standpoint of the light flux and the color rendering property. In the case where the light emitting device emitting light having a correlated color temperature in a range of 2,500 K or more and 4,750 K or less is to be achieved, the total content of the rare earth aluminate fluorescent materials with respect to the total fluorescent material content is preferably in a range of 0.4 or more and 0.6 or less, and more preferably in a range of 0.4 or more and 0.55 or less, from the standpoint of the light flux and the color rendering property.

The total content of the fourth fluorescent material and the fifth fluorescent material (hereinafter, the fourth fluorescent material and the fifth fluorescent material may be referred to collectively as "red light emitting fluorescent materials") with respect to the total fluorescent material content may be selected corresponding to the target correlated color temperature of the light emitting device. For example, in the case where the light emitting device emitting light having a correlated color temperature in a range of 4,750 K or more and 7,000 K or less is to be achieved, the content is preferably in a range of 0.25 or more and 0.5 or less, and more preferably in a range of 0.3 or more and 0.45 or less, from the standpoint of the light flux and the color rendering property. In the case where the light emitting device emitting light having a correlated color temperature in a range of 2,500 K or more and 4,750 K or less is to be achieved, the content of the red light emitting fluorescent materials to the total fluorescent material content is preferably in a range of 0.4 or more and 0.6 or less, and more preferably in a range of 0.45 or more and 0.55 or less, from the standpoint of the light flux and the color rendering property.

Rare Earth Aluminate Fluorescent Materials

The rare earth aluminate fluorescent materials include at least one kind of the first fluorescent material, the second fluorescent material, and the third fluorescent material described below, and include two or more kinds of fluorescent materials.

The first fluorescent material is a fluorescent material that is activated with trivalent cerium and has a composition represented by the following formula (I).

$$Y_3(Al,Ga)_5O_{12}:Ce \quad (I)$$

The light emission peak wavelength of the first fluorescent material is preferably in a range of 520 nm or more and 550 nm or less. The full width at half maximum of the first fluorescent material is preferably in a range of 95 nm or more and 120 nm or less.

The second fluorescent material is a fluorescent material that is activated with trivalent cerium and has a composition represented by the following formula (II).

$$Lu_3Al_5O_{12}:Ce \quad (II)$$

The light emission peak wavelength of the second fluorescent material is preferably in a range of 500 nm or more and 545 nm or less. The full width at half maximum of the second fluorescent material is preferably in a range of 95 nm or more and 105 nm or less.

The third fluorescent material is a fluorescent material that is activated with trivalent cerium and has a composition represented by the following formula (III).

$$Y_3Al_5O_{12}:Ce \quad (III)$$

The light emission peak wavelength of the third fluorescent material is preferably in a range of 535 nm or more and 555 nm or less. The full width at half maximum of the third fluorescent material is preferably in a range of 100 nm or more and 120 nm or less.

The maximum excitation wavelength of the rare earth aluminate fluorescent materials is preferably in a range of 220 nm or more and 490 nm or less, more preferably in a range of 430 nm or more and 470 nm or less, and further preferably in a range of 440 nm or more and 460 nm or less, in consideration of the light emission efficiency.

The average particle diameter of the rare earth aluminate fluorescent materials may be in a range, for example, of 5 μm or more and 30 μm or less, and is preferably in a range of 20 μm or more and 25 μm or less, in consideration of the enhancement of the light emission intensity and the workability in the production process of the light emitting device.

Fourth Fluorescent Material

The fourth fluorescent material is a fluoride fluorescent material that has a composition represented by the following formula (IV), is activated with tetravalent manganese, and emits red light. The fourth fluorescent material preferably has a light emission peak wavelength in a range of 610 nm or more and 650 nm or less.

$$A_2[M1_{1-p}Mn^{4+}{}_pF_6] \quad (IV)$$

In the formula (IV), A includes at least one kind of an element selected from the group consisting of K, Li, Na, Rb, Cs, and $NH_4^+$, in which A is preferably K, and M1 includes at least one kind of an element selected from the group consisting of a Group 4 element, a Group 13 element, and a Group 14 element. M1 preferably includes at least one kind of an element selected from the group consisting of silicon, aluminum, germanium, and titanium, and more preferably includes at least one kind of an element selected from the group consisting of silicon and aluminum. p represents a number satisfying $0<p<0.2$.

The full width at half maximum of the fourth fluorescent material in the light emission spectrum is preferably small, and may be, for example, 10 nm or less. The maximum excitation wavelength of the fourth fluorescent material is preferably in a range of 430 nm or more and 470 nm or less, and more preferably in a range of 440 nm or more and 460 nm or less, in consideration of the light emission efficiency.

The average particle diameter of the fourth fluorescent materials may be in a range, for example, of 5 μm or more and 50 μm or less, and is preferably in a range of 10 μm or more and 30 μm or less, in consideration of the enhancement of the light emission intensity and the workability in the production process of the light emitting device.

The light emitting device may include one kind of the fourth fluorescent material only, or may include a combination of two or more kinds of the fourth fluorescent materials having compositions different from each other.

Fifth Fluorescent Material

The fifth fluorescent material is a nitride fluorescent material that has a composition represented by the following formula (V), is activated with divalent europium, and emits red light.

$$(Sr,Ca)AlSiN_3:Eu \quad (v)$$

The fifth fluorescent material contains at least one kind selected from the group consisting of Sr and Ca, preferably contains both Sr and Ca, and preferably has a content of Sr in Sr and Ca of 0.8% by mol or more.

The light emission peak wavelength of the fifth fluorescent material is preferably in a range of 600 nm or more, and more preferably 615 nm or more. The light emission peak wavelength of the fifth fluorescent material is preferably in a range of 630 nm or less, and more preferably in a range of 620 nm or less. The light emission peak wavelength of the fifth fluorescent material may be selected corresponding to the target correlated color temperature of the light emitting device in consideration of the light flux and the color rendering property. For example, in the case where the light emitting device emitting light having a correlated color temperature in a range of 3,250 K or more and 7,000 K or less is to be achieved, the light emission peak wavelength of the fifth fluorescent material is preferably in a range of 600 nm or more and 620 nm or less. In the case where the light emitting device emitting light having a correlated color temperature in a range of 2,500 K or more and 3,250 K or less is to be achieved, the light emission peak wavelength of the fifth fluorescent material is preferably in a range of 615 nm or more and 630 nm or less.

The full width at half maximum of the fifth fluorescent material in the light emission spectrum may be, for example, 100 nm or less, and is preferably 80 nm or less, from the standpoint of the light flux and the color rendering property. The maximum excitation wavelength of the fifth fluorescent material is preferably in a range of 220 nm or more and 490 nm or less, more preferably in a range of 430 nm or more and 470 nm or less, and further preferably in a range of 440 nm or more and 460 nm or less, in consideration of the light emission efficiency.

The average particle diameter of the fifth fluorescent materials may be in a range, for example, of 5 μm or more and 30 μm or less, and is preferably in a range of 10 μm or more and 20 μm or less, in consideration of the enhancement of the light emission intensity and the workability in the production process of the light emitting device.

The light emitting device may include one kind of the fifth fluorescent material only, or may include a combination of two or more kinds of the fifth fluorescent materials having compositions different from each other.

Light Emission Spectrum of Light Emitting Device

The light emission spectrum of the light emitting device equipped with the fluorescent member including the aforementioned fluorescent materials is shown by the spectral distribution with the wavelength as the abscissa and the light emission intensity as the ordinate. In the light emission spectrum of the light emitting device, the light emission peak intensity ratio of the light emission peak of the fourth fluorescent material with respect to the light emission peak of the light emitting element may be selected corresponding to the target correlated color temperature of the light emitting device. For example, in the case where the light emitting device emitting light having a correlated color temperature in a range of 4,750 K or more and 7,000 K or less is to be achieved, the light emission peak intensity ratio of the light emission peak of the fourth fluorescent material with respect to the light emission peak of the light emitting element is preferably in a range of 1.0 or more and 2.0 or less, and more preferably in a range of 1.1 or more and 1.9 or less, from the standpoint of the light flux and the color rendering property. In the case where the light emitting device emitting light having a correlated color temperature in a range of 3,750 K or more and 4,750 K or less is to be achieved, the light emission peak intensity ratio of the light emission peak of the fourth fluorescent material with respect to the light emission peak of the light emitting element is preferably in a range of 2.0 or more and 3.5 or less, and more preferably in a range of 2.5 or more and 3.0 or less, from the standpoint of the light flux and the color rendering property. In the case where the light emitting device emitting light having a correlated color temperature in a range of 2,850 K or more and 3,750 K or less is to be achieved, the light emission peak intensity ratio of the light emission peak of the fourth fluorescent material with respect to the light emission peak of the light emitting element is preferably in a range of 3.5 or more and 5.5 or less, and more preferably in a range of 4.0 or more and 5.2 or less, from the standpoint of the light flux and the color rendering property. In the case where the light emitting device emitting light having a correlated color temperature in a range of 2,500 K or more and 2,850 K or less is to be achieved, the light emission peak intensity ratio of the light emission peak of the fourth fluorescent material with respect to the light emission peak of the light emitting element is preferably in a range of 5.5 or more and 7.0 or less, and more preferably in a range of 6.0 or more and 6.5 or less, from the standpoint of the light flux and the color rendering property.

Additional Fluorescent Material

The light emitting device may include an additional fluorescent material other than the first fluorescent material to the fifth fluorescent material as necessary. Examples of the additional fluorescent material include $(Sr,Ba,Ca)_{10}(PO_4)_6(Br,Cl)_2:Eu$, $(Y,Gd,Tb,Lu)_3(Al,Ga)_5O_{12}:Ce$ (provided that the compositions of the first to third fluorescent materials are excluded), $Ca_3Sc_2Si_3O_{12}$:Ce, $CaSc_2O_4$:Ce, $(La,Y)_3Si_6N_{11}$:Ce, $(Ca,Sr,Ba)_3Si_6O_9N_4$:Eu, $(Ca,Sr,Ba)_3Si_6O_{12}N_2$:Eu, $(Ba,Sr,Ca)Si_2O_2N_2$:Eu, $(Ca,Sr,Ba)_2Si_5N_8$:Eu, (Ca,Sr,Ba)S:Eu, and $(Ba,Sr,Ca)Ga_2S_4$:Eu. In the case where the light emitting device includes the additional fluorescent material, the content thereof may be appropriately regulated to provide particular light emission characteristics.

The fluorescent materials used may be commercially available fluorescent materials, and the fourth fluorescent material may be produced with reference to the production methods described in Japanese Patent Application No. 2014-202266 and Japanese Patent Application No. 2020-212532 applied by the present applicant. The additional fluorescent material may be produced, for example, in the following manner. An elementary substance, an oxide, a carbonate, a nitride, a chloride, a fluoride, a sulfide, and the like of the elements contained in the composition of the fluorescent material are used as raw materials, and the raw materials each are weighed to make the prescribed compositional ratio. An additive, such as a flux, is appropriately added to the raw materials, which are mixed by a wet method or a dry method with a mixer. According to the procedure, the solid state reaction can be facilitated to form particles having a uniform size. The mixer used may be a ball mill generally used industrially, and in addition, a pulverizer, such as a vibration mill, a roll mill, and a jet mill, may also be used. The raw materials may be pulverized with a pulverizer to increase the specific surface area. For regulating the specific surface area of the resulting fluorescent material particles to a certain range, classification may be performed with a wet classifier, such as a sedimentation tank, a hydrocyclone, and a centrifugal separator, and a dry classifier, such as a cyclone and an air separator, which are generally used industrially. The mixed raw material is charged in a crucible formed of SiC, quartz, alumina, BN, or the like, and calcined in an inert atmosphere, such as argon or nitrogen, or in a reducing atmosphere containing hydrogen. The calcining is performed at a prescribed temperature for a prescribed time. The calcined material is subjected to pulverization, dispersion, filtration, and the like, so as to provide the target fluorescent material powder. The solid-liquid separation may be performed by a method generally used industrially, such as filtration, suction filtration, pressure filtration, centrifugal separation, and decantation. The drying may be performed with an apparatus generally used industrially, such as a vacuum dryer, a hot air dryer, a conical dryer, and a rotary evaporator.

Fluorescent Member

The light emitting device include the fluorescent member that includes, for example, the fluorescent materials and a resin, and covers the light emitting element. Examples of the resin constituting the fluorescent member include a thermoplastic resin and a thermosetting resin. Specific examples of the thermosetting resin include an epoxy resin, a silicone resin, and a modified silicone resin, such as an epoxy-modified silicone resin.

The fluorescent member may include an additional component in addition to the fluorescent materials and the resin depending on necessity. Examples of the additional component include a filler, such as silica, barium titanate, titanium oxide, and aluminum oxide, a light stabilizer, and a colorant. In the case where the fluorescent member includes the additional component, the content thereof is not particularly limited and may be selected depending on the purpose and the like. For example, in the case where a filler is contained as the additional component, the content may be 0.01 to 20% by mass based on the resin.

Lighting Fixture

It suffices that the lighting fixture includes at least one kind of the aforementioned light emitting device. The lighting fixture may include at least one kind of the aforementioned light emitting device, and a known light emitting device that emits white mixed light in combination. The lighting fixture may further include, in addition to the light emitting device, a reflecting member, a protective member, an auxiliary device for supplying electric power to the light emitting device, and the like. The lighting fixture may include plurality of the light emitting devices. In the case where the lighting fixture includes the plural light emitting devices, the plural light emitting devices that are the same as each other may be provided, and the plural light emitting devices that are different in correlated color temperature from each other may be provided. A driving device may be provided to drive the plural light emitting devices individually, so as to enable adjustment of the brightness and the correlated color temperature depending on desire. The usage mode of the lighting fixture may be any of a direct mount type, an embedded type, a suspended type, and the like.

EXAMPLES

Examples of the present invention will be specifically described below.

(Fluorescent Material)

Before production of light emitting devices, the following fluorescent materials were prepared as fluorescent materials used in Examples and Comparative Examples.

$$Y_3(Al,Ga)_5O_{12}:Ce \quad (I)$$

$$Lu_3Al_5O_{12}:Ce \quad (II)$$

$$Y_3Al_5O_{12}:Ce \quad (III)$$

$$A_2[M1_{1-p}Mn^{4+}{}_pF_6] \quad (IV)$$

(wherein in the formula (IV), A represents K, M1 represents Si, and p represents a number satisfying $0<p<0.2$)

$$(Sr,Ca)AlSiN_3:Eu \quad (V)$$

As the first fluorescent material, a rare earth aluminate fluorescent material having a composition represented by the formula (I), a light emission peak wavelength of 545 nm, and a full width at half maximum of 104.0 nm (which may be hereinafter referred to as "GYAG1") and a rare earth aluminate fluorescent material having a composition represented by the formula (I), a light emission peak wavelength of 533 nm, and a full width at half maximum of 107.0 nm (which may be hereinafter referred to as "GYAG2") were prepared.

As the second fluorescent material, a rare earth aluminate fluorescent material having a composition represented by the formula (II), a light emission peak wavelength of 533 nm, and a full width at half maximum of 100.5 nm (which may be hereinafter referred to as "LAG") was prepared.

As the third fluorescent material, a rare earth aluminate fluorescent material having a composition represented by the formula (III), a light emission peak wavelength of 545 nm, and a full width at half maximum of 109.5 nm (which may be hereinafter referred to as "YAG") was prepared.

As the fourth fluorescent material, a fluoride fluorescent material having a composition represented by the formula (IV), a light emission peak wavelength of 630 nm, and a full width at half maximum of 14 nm, emitting red light (which may be hereinafter referred to as "KSF") was prepared.

As the fifth fluorescent material, a nitride fluorescent material having a composition represented by the formula (V), a light emission peak wavelength in a range of 600 nm or more and 630 nm or less, and a full width at half maximum of 80 nm, emitting red light (which may be hereinafter referred to as "SCASN") was prepared.

As the fluorescent material used in the light emitting devices of Comparative Examples, a chlorosilicate fluorescent material having a composition represented by the following formula (VI), a light emission peak wavelength of 521 nm, and a full width at half maximum of 63 nm was prepared.

$$Ca_8MgSi_4O_{16}Cl_{12}:Eu \quad (VI)$$

The light emission peak wavelengths and the full widths at half maximum of the fluorescent materials described above can be regulated by changing the production conditions, the compositions, and the like of the fluorescent materials.

As the light emitting element, a gallium nitride-based semiconductor light emitting element having a light emission peak wavelength of 450 nm was prepared.

Example 1

Production of Light Emitting Device

A light emitting device was produced by combining the blue LED (light emitting element) having a light emission peak wavelength of 450 nm, GYAG1 as the first fluorescent material and LAG as the second fluorescent material as the rare earth aluminate fluorescent materials, KSF as the fourth fluorescent material, and SCASN as the fifth fluorescent material.

The fluorescent materials blended to make the contents of the fluorescent materials shown in Table 1 below providing a correlated color temperature around 6,500 K were added to a silicone resin, and mixed and dispersed therein, and then the mixture was defoamed to provide a fluorescent material-containing resin composition. The fluorescent material-containing resin composition was then injected and charged on the light emitting element, and the resin composition was cured by heating. A light emitting device was produced in this manner.

Examples 2 to 6

Light emitting devices of Examples 2 to 6 were produced to provide a correlated color temperature around 2,700 K to 5,000 K in the same manner as in Example 1 except that the combination of the two or more kinds of the rare earth aluminate fluorescent materials containing at least one kind selected from the group consisting of the first fluorescent material, the second fluorescent material, and the third fluorescent material, the fourth fluorescent material, and the fifth fluorescent material, and the content ratios of the fluorescent materials were changed to the values shown in Table 1 below.

TABLE 1

| | Example 1 | Example 2 | Example 3 | Example 4 | Example 5 | Example 6 |
|---|---|---|---|---|---|---|
| Rare earth aluminate fluorescent material | LAG + GYAG1 | LAG + GYAG1 | GYAG2 + YAG | GYAG2 + YAG | LAG + GYAG1 | LAG + GYAG1 |
| Fluorescent material content ratio (%) content of fourth fluorescent material/total fluorescent material content | 29.5 | 38.0 | 49.3 | 52.8 | 47.6 | 41.9 |
| Fluorescent material content ratio (%) content of fourth fluorescent material/total content of rare earth aluminate fluorescent materials | 0.43 | 0.63 | 1.03 | 1.19 | 0.97 | 0.76 |
| Light emission peak intensity fourth fluorescent material/light emitting element | 1.20 | 1.89 | 3.00 | 4.01 | 5.19 | 6.35 |
| Fluorescent material content ratio (%) total content of rare earth aluminate fluorescent materials/total fluorescent material content | 68.9 | 60.0 | 48.1 | 44.4 | 49.0 | 55.4 |
| Fluorescent material content ratio (%) total content of red light emitting fluorescent materials/total fluorescent material content | 31.1 | 40.0 | 51.9 | 55.6 | 51.0 | 44.6 |
| x | 0.312 | 0.345 | 0.384 | 0.407 | 0.434 | 0.457 |
| y | 0.329 | 0.356 | 0.379 | 0.392 | 0.403 | 0.409 |
| Correlated color temperature (K) | 6532 | 4992 | 3921 | 3465 | 3023 | 2727 |

The light emitting devices of Examples 1 to 6 were measured for the chromaticity coordinate, the correlated color temperature (Tcp, K), the average color rendering index (Ra (R1 to R8)), and the special color rendering indices (R9 to R15) of the emitted light. Specifically, the light emitting devices used in Examples and Comparative Examples were measured for the chromaticity coordinate (x,y) in the chromaticity coordinate system of the CIE 1931 chromaticity diagram, the light flux, and the radiant flux (spectral total radiant flux) with a photometric system combining a spectral photometric analyzer (PMA-12, manufactured by Hamamatsu Photonics K.K.) and an integral sphere. The results of the chromaticity coordinate and the correlated color temperature (Tcp, K) of the emitted light are shown in Table 1. The results of the color rendering indices are shown in Table 2 below.

The light emission spectra of the light emitting devices of Examples and Comparative Examples described later were measured with a spectrofluorometer. The light emission peak intensity ratios of the light emission peak of the fourth fluorescent material with respect to the light emission peak of the light emitting element are shown in Table 1. FIGS. 2 to 7 show the light emission spectra of the light emitting devices of Examples 1 to 6 with the spectra of the standard light sources.

TABLE 2

| | Example 1 | Example 2 | Example 3 | Example 4 | Example 5 | Example 6 |
|---|---|---|---|---|---|---|
| Ra | 94.6 | 95.4 | 93.9 | 94.6 | 95.1 | 95.9 |
| R1 | 96.3 | 97.4 | 96.7 | 97.2 | 97.0 | 98.5 |
| R2 | 94.9 | 95.7 | 94.0 | 95.2 | 97.8 | 99.3 |
| R3 | 90.4 | 90.7 | 88.5 | 90.5 | 96.7 | 99.0 |
| R4 | 96.0 | 96.7 | 95.1 | 95.6 | 97.0 | 98.9 |
| R5 | 94.3 | 95.2 | 94.4 | 95.4 | 96.3 | 98.6 |
| R6 | 90.2 | 91.8 | 90.8 | 93.2 | 96.3 | 94.8 |
| R7 | 97.8 | 98.3 | 96.2 | 96.2 | 93.4 | 92.2 |
| R8 | 97.2 | 97.6 | 95.0 | 93.4 | 86.5 | 85.6 |
| R9 | 88.6 | 90.5 | 82.0 | 79.4 | 67.7 | 67.8 |
| R10 | 85.4 | 86.8 | 82.6 | 85.7 | 92.6 | 97.7 |
| R11 | 94.2 | 94.7 | 93.6 | 94.6 | 97.5 | 96.3 |
| R12 | 64.1 | 64.9 | 66.1 | 71.8 | 80.4 | 87.2 |
| R13 | 96.1 | 97.0 | 95.6 | 96.2 | 97.2 | 99.1 |
| R14 | 94.3 | 94.0 | 92.3 | 93.2 | 96.7 | 98.0 |
| R15 | 95.6 | 96.0 | 96.0 | 95.5 | 93.2 | 93.6 |

Comparative Example 1

A light emitting device was produced to provide a correlated color temperature around 6,500 K in the same manner as in Example 1 except that the fourth fluorescent material was not used, but a combination of the chlorosilicate fluorescent material having a composition represented by the formula (VI) and a light emission peak wavelength of 521 nm, the first fluorescent material GYAG2, and the fifth fluorescent material SCASN was used as the fluorescent material, and the contents of the fluorescent materials were allowed to be the values shown in Table 3 below.

Comparative Examples 2 to 6

Light emitting devices of Comparative Examples 2 to 6 were produced to provide a correlated color temperature around 2,700 K to 5,000 K in the same manner as in Comparative Example 1 except that the amounts of the fluorescent materials were changed to make the content ratios of the fluorescent materials shown in Table 3 below.

TABLE 3

| | Comparative Example 1 | Comparative Example 2 | Comparative Example 3 | Comparative Example 4 | Comparative Example 5 | Comparative Example 6 |
|---|---|---|---|---|---|---|
| Rare earth aluminate fluorescent material | GYAG2 + chlorosilicate | GYAG2 + chlorosilicate | GYAG2 + chlorosilicate | GYAG2 + chlorosilicate | GYAG2 + chlorosilicate | GYAG2 + chlorosilicate |
| Fluorescent material content ratio (%) content of fourth | 93.0 | 92.5 | 92.1 | 91.8 | 91.6 | 89.4 |

TABLE 3-continued

| | Comparative Example 1 | Comparative Example 2 | Comparative Example 3 | Comparative Example 4 | Comparative Example 5 | Comparative Example 6 |
|---|---|---|---|---|---|---|
| fluorescent material/total fluorescent material content | | | | | | |
| Fluorescent material content ratio (%) total content of red light emitting fluorescent materials/total fluorescent material content | 7.0 | 7.5 | 7.9 | 8.2 | 8.4 | 10.6 |
| x | 0.312 | 0.345 | 0.384 | 0.407 | 0.434 | 0.457 |
| y | 0.329 | 0.356 | 0.379 | 0.392 | 0.403 | 0.409 |
| Correlated color temperature (K) | 6500 | 5000 | 4000 | 3500 | 3000 | 2700 |

The light emitting devices of Comparative Examples 1 to 6 were measured for the chromaticity coordinate of the light emitting devices in the same manner as in the light emitting devices of Examples, and shown in Table 3, and the results of the color rendering indices are shown in Table 4 below.

TABLE 4

| | Comparative Example 1 | Comparative Example 2 | Comparative Example 3 | Comparative Example 4 | Comparative Example 5 | Comparative Example 6 |
|---|---|---|---|---|---|---|
| Ra | 95.7 | 94.7 | 94.3 | 91.6 | 94.6 | 94.6 |
| R1 | 96.6 | 95.8 | 96.2 | 92.9 | 96.9 | 96.9 |
| R2 | 98.8 | 97.0 | 96.8 | 94.3 | 98.4 | 98.4 |
| R3 | 97.5 | 97.7 | 96.5 | 94.9 | 98.8 | 98.8 |
| R4 | 98.7 | 96.8 | 96.6 | 93.9 | 97.5 | 97.5 |
| R5 | 95.7 | 94.5 | 95.5 | 92.0 | 97.6 | 97.6 |
| R6 | 93.7 | 94.4 | 94.4 | 92.6 | 96.0 | 96.0 |
| R7 | 94.5 | 94.1 | 93.7 | 92.4 | 91.1 | 91.1 |
| R8 | 89.8 | 84.8 | 85.0 | 80.1 | 80.5 | 80.5 |
| R9 | 73.4 | 58.5 | 60.7 | 49.2 | 55.1 | 55.1 |
| R10 | 97.5 | 92.3 | 91.7 | 85.5 | 96.8 | 96.8 |
| R11 | 94.6 | 96.0 | 94.9 | 94.5 | 93.5 | 93.5 |
| R12 | 66.8 | 66.3 | 72.6 | 70.4 | 85.7 | 85.7 |
| R13 | 98.4 | 96.9 | 97.0 | 93.5 | 98.0 | 98.0 |
| R14 | 98.3 | 98.5 | 97.7 | 96.5 | 99.2 | 99.2 |
| R15 | 95.0 | 90.5 | 91.7 | 87.3 | 89.9 | 89.9 |

As shown in Tables 2 and 4, in the comparison in Ra and R15 of the light emitting devices of Examples and Comparative Examples having substantially the same correlated color temperature, approximately equivalent values were obtained in Examples and Comparative Examples for Ra. For R15, on the other hand, higher values were obtained in the light emitting devices of Examples than Comparative Examples at the respective correlated color temperatures, from which it was understood that the light emitting devices of Examples had a higher color rendering property than the light emitting devices of Comparative Examples at the particular color rendering index. In the comparison of the light emitting devices of Examples and the light emitting devices of Comparative Examples having substantially the same correlated color temperature, assuming that the light fluxes of the light emitting devices of Comparative Examples each were 100%, the relative light fluxes of the light emitting devices of Examples were 108.6% for the light emitting device of Example 1, 111.2% for the light emitting device of Example 2, 115.5% for the light emitting device of Example 3, 117.7% for the light emitting device of Example 4, 114.0% for the light emitting device of Example 5, and 111.8% for Example 6. In any of the light emitting devices of Examples, a higher light flux was obtained.

It was understood from the above that the light emitting devices of Examples each had a higher light flux and a higher color rendering property.

FIGS. 2 to 7 each show the light emission spectrum of each of the light emitting devices of Examples 1 to 6 and Comparative Examples 1 to 6, and the spectrum of the standard light source of each of the correlated color temperatures. The light emitting devices of Examples 1 to 6 emitted light having correlated color temperatures near correlated color temperatures of 6,500 K, 5,000 K, 4,000 K, 3,500 K, 3,000 K, and 2,700 K, respectively. In the light emitting devices of Examples 1 to 3 emitting light having correlated color temperatures near 6,500 K, 5,000 K, and 4,000 K, respectively, the light emission spectrum of blue-violet color to blue color in a range of 430 nm or more and 470 nm or less was suppressed from becoming an especially high intensity, and the light emission spectra were approximated to the light emission spectra of the standard light sources, respectively. In the light emitting devices of Examples 4 to 6 emitting light having correlated color temperatures near 3,500 K, 3,000 K, and 2,700 K, respectively, the light emission spectrum of blue-violet color to blue color was suppressed from becoming an especially high intensity, and the intensity of the light emission spectrum in a wavelength range of yellow color to green color, i.e., a wavelength range of 495 nm to 584 nm according to JIS Z8110, did not become higher than the intensity of the light emission spectrum of the standard light source, resulting in further approximation to the standard light source.

INDUSTRIAL APPLICABILITY

The light emitting device of the present description can be applied to an illumination equipment excellent in light emission characteristics, an LED display, a flashlight of camera, and the like. In particular, the light emitting device can be favorably applied to an illumination equipment and a light source that are demanded to achieve a high light flux and a high color rendering property. Furthermore, the light emitting device can be used as a lighting fixture including the light emitting device.

EXPLANATIONS OF LETTERS OR NUMERALS

10: Light emitting element, 50: Fluorescent member, 70: Fluorescent material, 71, 72: First to third fluorescent material, 73: Fourth fluorescent material, 74: Fifth fluorescent material, 100: Light emitting device

The invention claimed is:

1. A light emitting device comprising a light emitting element having a light emission peak wavelength in a range of 430 nm or more and 470 nm or less, and a fluorescent member including fluorescent material consisting of two or more kinds of rare earth aluminate fluorescent materials including at least one kind selected from the group consisting of a first fluorescent material having a composition represented by the following formula (I), a second fluorescent material having a composition represented by the following formula (II), and a third fluorescent material having a composition represented by the following formula (III), a fourth fluorescent material having a composition represented by the following formula (IV), and a fifth fluorescent material having a composition represented by the following formula (V):

$$Y_3(Al,Ga)_5O_{12}:Ce \quad (I)$$

$$Lu_3Al_5O_{12}:Ce \quad (II)$$

$$Y_3Al_5O_{12}:Ce \quad (III)$$

$$A_2[M1_{1-p}Mn^{4+}_pF_6] \quad (IV)$$

$$(Sr,Ca)AlSiN_3:Eu \quad (V)$$

wherein in the formula (IV), A includes at least one kind selected from the group consisting of K, Li, Na, Rb, Cs, and $NH_4^+$, M1 includes at least one kind of element selected from the group consisting of a Group 4 element, a Group 13 element, and a Group 14 element, and p represents a number satisfying $0<p<0.2$.

2. The light emitting device according to claim 1, wherein a content of the fourth fluorescent material with respect to a total content of the rare earth aluminate fluorescent materials is in a range of 0.35 or more and 0.7 or less, and wherein the light emitting device emits light having a correlated color temperature in a range of 4,750 K or more and 7,000 K or less.

3. The light emitting device according to claim 1, wherein a content of the fourth fluorescent material with respect to a total content of the rare earth aluminate fluorescent materials is in a range of 0.7 or more and 1.3 or less, and wherein the light emitting device emits light having a correlated color temperature in a range of 2,500 K or more and 4,750 K or less.

4. The light emitting device according to claim 1, wherein a content of the fourth fluorescent material with respect to a total content of the rare earth aluminate fluorescent materials, the fourth fluorescent material, and the fifth fluorescent material is in a range of 0.25 or more and 0.45 or less, and wherein the light emitting device emits light having a correlated color temperature in a range of 4,750 K or more and 7,000 K or less.

5. The light emitting device according to claim 1, wherein a content of the fourth fluorescent material with respect to a total content of the rare earth aluminate fluorescent materials, the fourth fluorescent material, and the fifth fluorescent material is in a range of 0.4 or more and 0.6 or less, and wherein the light emitting device emits light having a correlated color temperature in a range of 2,500 K or more and 4,750 K or less.

6. The light emitting device according to claim 1, wherein a total content of the rare earth aluminate fluorescent materials with respect to a total content of the rare earth aluminate fluorescent materials, the fourth fluorescent material, and the fifth fluorescent material is in a range of 0.5 or more and 0.75 or less, and wherein the light emitting device emits light having a correlated color temperature in a range of 4,750 K or more and 7,000 K or less.

7. The light emitting device according to claim 1, wherein a total content of the rare earth aluminate fluorescent materials with respect to a total content of the rare earth aluminate fluorescent materials, the fourth fluorescent material, and the fifth fluorescent material is in a range of 0.4 or more and 0.6 or less, and wherein the light emitting device emits light having a correlated color temperature in a range of 2,500 K or more and 4,750 K or less.

8. The light emitting device according to claim 1, wherein a total content of the fourth fluorescent material and the fifth fluorescent material with respect to a total content of the rare earth aluminate fluorescent materials, the fourth fluorescent material, and the fifth fluorescent material is in a range of 0.25 or more and 0.5 or less, and wherein the light emitting device emits light having a correlated color temperature in a range of 4,750 K or more and 7,000 K or less.

9. The light emitting device according to claim 1, wherein a total content of the fourth fluorescent material and the fifth fluorescent material with respect to a total content of the rare earth aluminate fluorescent materials, the fourth fluorescent material, and the fifth fluorescent material is in a range of 0.4 or more and 0.6 or less, and wherein the light emitting device emits light having a correlated color temperature in a range of 2,500 K or more and 4,750 K or less.

10. The light emitting device according to claim 1, wherein the light emitting device has a light emission spectrum having a light emission peak intensity ratio of a light emission peak of the fourth fluorescent material with respect to a light emission peak of the light emitting element in a range of 1.0 or more and 2.0 or less, and emits light having a correlated color temperature in a range of 4,750 K or more and 7,000 K or less.

11. The light emitting device according to claim 1, wherein the light emitting device has a light emission spectrum having a light emission peak intensity ratio of a light emission peak of the fourth fluorescent material with respect to a light emission peak of the light emitting element in a range of 2.0 or more and 3.5 or less, and emits light having a correlated color temperature in a range of 3,250 K or more and 4,750 K or less.

12. The light emitting device according to claim 1, wherein the light emitting device has a light emission spectrum having a light emission peak intensity ratio of a light emission peak of the fourth fluorescent material with respect to a light emission peak of the light emitting element in a range of 3.5 or more and 5.5 or less, and emits light having a correlated color temperature in a range of 2,850 K or more and 3,250 K or less.

13. The light emitting device according to claim 1, wherein the light emitting device has a light emission spectrum having a light emission peak intensity ratio of a light emission peak of the fourth fluorescent material with respect to a light emission peak of the light emitting element in a range of 5.5 or more and 7.0 or less, and emits light having a correlated color temperature in a range of 2,500 K or more and 2,850 K or less.

14. The light emitting device according to claim 1, wherein the light emitting element has a light emission peak wavelength in a range of 440 nm or more and 460 nm or less.

15. The light emitting device according to claim 1, wherein the first fluorescent material has a light emission peak wavelength in a range of 520 nm or more and 550 nm or less and a full width at half maximum in a range of 95 nm or more and 120 nm or less.

16. The light emitting device according to claim 1, wherein the second fluorescent material has a light emission peak wavelength in a range of 500 nm or more and 545 nm or less and a full width at half maximum in a range of 95 nm or more and 105 nm or less.

17. The light emitting device according to claim 1, wherein the third fluorescent material has a light emission peak wavelength in a range of 535 nm or more and 555 nm or less and a full width at half maximum in a range of 100 nm or more and 120 nm or less.

18. The light emitting device according to claim 1, wherein the fifth fluorescent material has a light emission peak wavelength in a range of 600 nm or more and 630 nm or less and a full width at half maximum of 80 nm or less.

19. The light emitting device according to claim 1, wherein the light emitting device has an average color rendering index Ra of 90 or more or a special color rendering index R15 of 85 or more.

20. A lighting fixture comprising the light emitting device according to claim 1.

21. The light emitting device according to claim 1, wherein the fourth fluorescent material has a full width at half maximum of 10 nm or less.

22. The light emitting device according to claim 1, wherein in the formula (IV), A is K, and M1 includes at least one kind of an element selected from the group consisting of silicon and aluminum.

* * * * *